United States Patent [19]
Britton et al.

[11] Patent Number: 6,049,224
[45] Date of Patent: Apr. 11, 2000

[54] PROGRAMMABLE LOGIC DEVICE WITH LOGIC CELLS HAVING A FLEXIBLE INPUT STRUCTURE

[75] Inventors: Barry K. Britton, Orefield, Pa.; Ian L. McEwen, Golden, Colo.; Ho T. Nguyen, Allentown, Pa.; Satwant Singh, Macungie, Pa.; Carolyn W. Spivak, Emmaus, Pa.; Richard G. Stuby, Jr., New Tripoli, Pa.

[73] Assignee: Lucent Technologies Inc., Murray Hill, N.J.

[21] Appl. No.: 08/950,624

[22] Filed: Oct. 15, 1997

[51] Int. Cl.[7] .................. H01L 25/00; H03K 19/177; H03K 19/173
[52] U.S. Cl. ................................. 326/41; 326/38
[58] Field of Search ..................... 326/41, 47, 39, 326/40, 38

[56] References Cited

U.S. PATENT DOCUMENTS

| | | | |
|---|---|---|---|
| 5,260,611 | 11/1993 | Cliff et al. | 326/41 |
| 5,386,156 | 1/1995 | Britton et al. | 326/37 |
| 5,436,574 | 7/1995 | Veenstra | 326/39 |
| 5,481,486 | 1/1996 | Cliff et al. | 364/716 |
| 5,815,003 | 9/1998 | Pedersen | 326/39 |
| 5,905,385 | 5/1999 | Sharpe-Geisler | 326/39 |

*Primary Examiner*—Michael Tokar
*Assistant Examiner*—Daniel D. Chang

[57] ABSTRACT

A programmable logic device, such as an FPGA, is implemented using logic cells that have configurable connection schemes between routing resources and logic element input pins. For example, in one embodiment, each logic cell in the device has a flexible input structure that supports two or more different connection schemes, which may or may not involve input sharing, where each logic cell can be individually programmed for any of the available connection schemes when the device is configured. As such, the device can be efficiently programmed to implement the user's specific circuitry. The invention balances the competing goals of (1) reducing routing requirements by limiting the number of connections between routing resources and logic element input pins and (2) providing minimally constrained programming of logic elements.

24 Claims, 5 Drawing Sheets

PROGRAMMABLE LOGIC DEVICE WITH LOGIC CELLS HAVING A FLEXIBLE INPUT STRUCTURE

BACKGROUND OF THE INVENTION

1. Field of the Invention

The present invention relates to integrated circuits, and, in particular, to high-density programmable logic devices (PLDs), such as field programmable gate arrays (FPGAs).

2. Description of the Related Art

One of the primary problems in FPGA architectures is the design of structures connecting routing resources to logic cell inputs. These structures must provide switching for signals connecting to the input pins of the look-up tables (LUTs), flip-flops (FFs), and other logic elements within an FPGA logic cell (typically, but not necessarily, within the programmable function unit (PFU) of the logic cell). Typically, the number of pins on the logic elements is different from the number of routing resources available.

The connections between routing resources and logic cell inputs is generally recognized as one of the keys to successful FPGA architectures. Architectures with too many of these connections tend to be slower and use more silicon area. Providing unlimited access to logic cells with large numbers of input pins can lead to congestion in the global routing. Such designs can require an excessive number of global routing tracks. On the other hand, architectures that have too few of these connections can suffer routability problems where the density of logic elements is high or require underutilization of logic elements. Either of these will result in a reduction in the amount of user-defined logic that can be implemented in a given device, which is inefficient.

To address these problems, some FPGA architectures have implemented input sharing between logic cell input pins. Input sharing means that two or more different logic cell input pins are constrained to use the same user-defined signal. In existing FPGAs, this constraint is fixed. That is, two pins that have a shared input always share that input, independent of the user-defined programming. Such input sharing reduces the flexibility of the connections between routing and logic element input pins, which, in turn, typically reduces the average amount of logic that can be implemented by the logic elements.

FIGS. 1 and 2 show examples in which the PFU of a logic cell contains three 4-input look-up tables (LUT1, LUT2, and LUT3). The total number of input pins of the PFU is m, the number of routing resources that could possibly be connected to the input pins is n, and the maximum number of distinct user-defined signals that can be connected to the LUT inputs is k. The input structure comprises a switch and a set of interconnections. The switch is multiport, typically implemented as pass transistors, multiplexors, antifuses, fuses, etc.

FIG. 1 shows a prior-art architecture in which the input structure has a distinct connection for every logic element input pin. This fixed input structure involves no sharing of input signals between any of the LUT input pins. In this case, the value of k always equals the value of m (i.e., in this example, 12). This provides the maximum amount of flexibility for packing logic into the LUTs, since none of the LUTs needs to share an input signal with any other LUT. The costs of such a connection scheme, however, quickly grow prohibitive as the number of input pins m gets large. This is due to the fact that the programmable routing used to route the logic elements together must always be able to handle the worst case where every input pin m has a distinct signal on it. In addition, speed performance will suffer, as the loading grows quickly due to the need to provide a complete set of connections. Various schemes have been used in existing FPGAs in the design of this input structure to connect the n routing signals to the k input signals. One is a fully populated switch, where any of the n inputs to the switch can connect to any of the k outputs, while maintaining the fact that k is equal to the number of logic element input pins m.

FIG. 2 shows a prior-art architecture having a fixed input structure that involves the use of input sharing, where two or more logic elements are constrained to use the same distinct input signal on one or more of their pins. In this case, the number of distinct input signals k is fixed to be less than the number of logic element inputs m. For the particular example shown, each pair of adjacent LUTs shares one input. Thus, k is equal to 10, while m remains at 12. This reduces the amount of logic, but also reduces the amount of programmable routing required to connect the logic elements together since the maximum possible distinct input signals k will always be less than the number of input pins m. In the example of FIG. 2, if the logic to be implemented does not involve LUTs that can share an input, the PFU cannot be fully utilized. Other schemes have used less than fully populated switches, sometimes combined with input sharing. All of the prior-art architectures that rely on input sharing have a fixed amount of input sharing, where every instance of the logic cell forces the same sharing scheme between internal logic elements, such as LUTs, of the input signals, no matter what the requirements demanded by the user's circuitry of a particular logic element might be.

SUMMARY OF THE INVENTION

The present invention provides a flexible input structure for connecting device routing to logic element input pins. This structure allows user signals in the routing to be flexibly shared among the logic element inputs. The extent of the sharing is defined by the configuration of the device per logic cell, within limits possibly set by the hardware implementation. The invention provides flexibility in the number of available connections on a configurable basis per each instance of the given logic cell, allowing for higher density and speed with a smaller impact on routing.

The present invention can be characterized as a programmable logic device (PLD) comprising a plurality of logic cells, wherein at least one logic cell has a flexible input structure that supports two or more different configurable connection schemes between routing resources and input pins of one or more logic elements within the logic cell, wherein at least one of the configurable connection schemes requires input sharing between two or more logic elements. The present invention can also be characterized as a PLD comprising a plurality of logic cells, wherein at least one logic cell has a flexible input structure that supports two or more different configurable connection schemes between routing resources and input pins of one or more logic elements within the logic cell, wherein the maximum number of possible connections for any connection scheme between the routing resources and the logic element input pins is less than the number of logic element input pins. Alternative, the present invention can be characterized as a PLD comprising a plurality of logic cells, each logic cell comprising a number of connections between routing resources and at least one programmable function unit (PFU) having a number of inputs, where the maximum number of connections is less than the number of inputs to the PFU and the distribution of the connections to the PFU inputs is configurable from logic cell to logic cell within the PLD.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

According to the present invention, a programmable logic device, such as an FPGA, is implemented using logic cells that have configurable connection schemes between routing resources and logic element input pins. For example, in one embodiment, each logic cell in the device has a flexible input structure (FINS) that supports two or more different connection schemes, which may or may not involve input sharing, where each logic cell can be individually programmed for any of the available connection schemes when the device is configured. As such, the device can be efficiently programmed to implement the user's specific circuitry.

Figure 1:
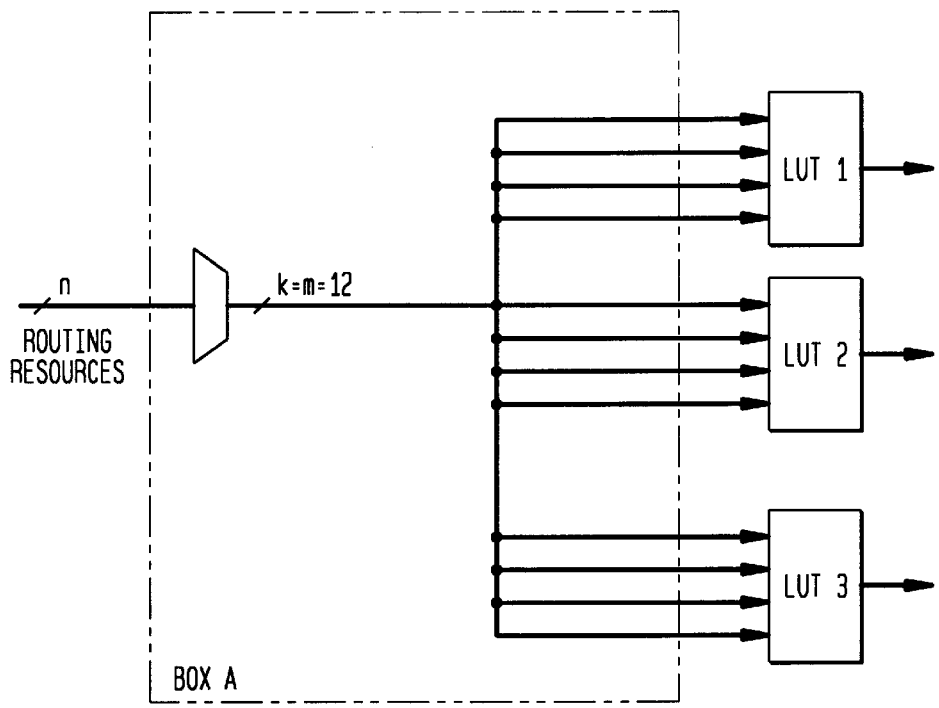
FIG. 1 shows a prior-art architecture in which the input structure has a distinct connection for every logic element input pin.
Figure 2:
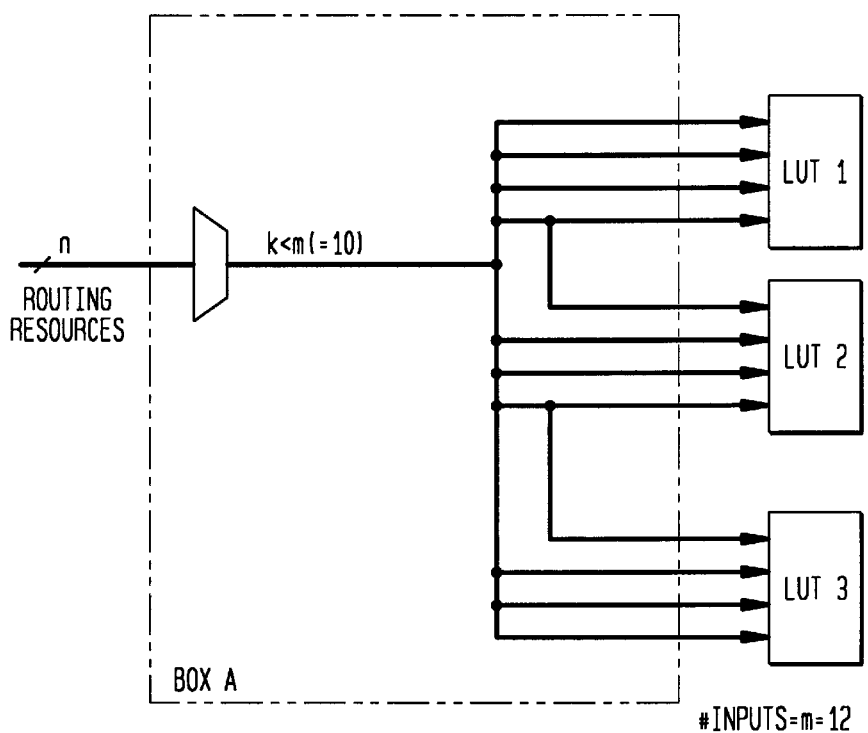
FIG. 2 shows a prior-art architecture having a fixed input structure that involves the use of input sharing, where two or more logic elements are constrained to use the same distinct input signal on one or more of their pins.

FIGS. 3A and 3B show two different instances of an FPGA logic cell having a flexible input structure, according to one embodiment of the present invention. The FINS provides the connections between the routing resources and the inputs to the programmable function unit. As in the prior-art examples of FIGS. 1 and 2, each logic cell has a PFU with three logic elements (i.e., 4-input look-up tables LUT1, LUT2, and LUT3). Each logic element input pin has a separate wire going to it, thus m continues to equal 12. However, the input switching structure in FIGS. 3A–B is not fully populated, and it involves some sharing of inputs. Thus, k is less than m, as in the prior-art example of FIG. 2. However, according to the present invention, the sharing of the k user-defined input signals between logic elements is variable (i.e., flexible), where the particular connection scheme is selected as needed per instance of the logic cell.

In the instance of FIG. 3A, LUT1 and LUT2 share two inputs, while LUT2 and LUT3 share one input. In the instance of FIG. 3B, however, LUT1 and LUT2 share three inputs, while all four inputs to LUT3 are distinct (i.e., not shared with any other logic element). The maximum number of connections k is the same for both instances of the logic cell, but how those k connections are distributed to the m input pins is different. The particular connection scheme is selected when the FPGA is configured (i.e., programmed) by configuring the flexible input structure of the logic cell, where each logic cell can be configured independently of every other logic cell. That is, different logic cells within the same FPGA can be configured with different connection schemes.

In some embodiments of the present invention, for a given logic cell architecture, the number of routing resources n, the number of connections k, and the number of input pins m are all fixed to be identical for all PFUs. For example, in one preferred FPGA design, for each logic cell, n is 50, k is 35, and m is 50. This means that only 35 input signals are available for the 50 PFU input pins. According to the present invention, the specific manner in which those 35 user-defined input signals are distributed to the 50 input pins is selected when the FPGA is configured. The distribution of input signals to input pins may involve the sharing of individual input signals by two or more input pins and/or one or more input pins not being connected to any input signal. For a particular logic cell design, there is a fixed number of different connection schemes available from which the user may select for each instance of the logic cell in the device, on a logic cell by logic cell basis.

In an alternative embodiment, an FPGA or other programmable logic device may comprise two or more different types of logic cells, where each type of logic cell has a different flexible input structure that supports a different set of available connection schemes, where n, k, and/or m may vary between types of logic cell. Moreover, devices may be designed with logic cells that support different sets of available connection schemes depending on the operational mode of the logic cell (e.g., multiplier mode, general logic mode, memory mode, comparator mode, or datapath with ripple carry mode). For example, when the logic cell is programmed to operate in a first operational mode (e.g., multiplier mode), a first set of different connection schemes may be available for configuring the logic cell, and, when the logic cell is programmed to operate in a second operational mode (e.g., memory mode), a second set of different connection schemes may be available for configuring the logic cell, where the first and second sets are different. Depending on the architecture, the maximum number of connections k between the routing resources and the logic element input pins may vary from one of these sets of connection schemes to another.

In general, the present invention is directed to any programmable logic device, such as an FPGA, that has one or more logic cells having a flexible input structure that supports different connection schemes, where the connection scheme can be independently selected for each logic cell, when the device is configured. One or more of these different connection schemes may (but does not have to) involve input sharing, where the sharing scheme can be configured to be different for each instance of the logic cell. The total number of distinct input signals available to the logic element inputs is less than the number of logic element inputs, but exactly how those distinct input signals are shared among the logic element inputs is programmable per logic cell instance.

Figure 4:
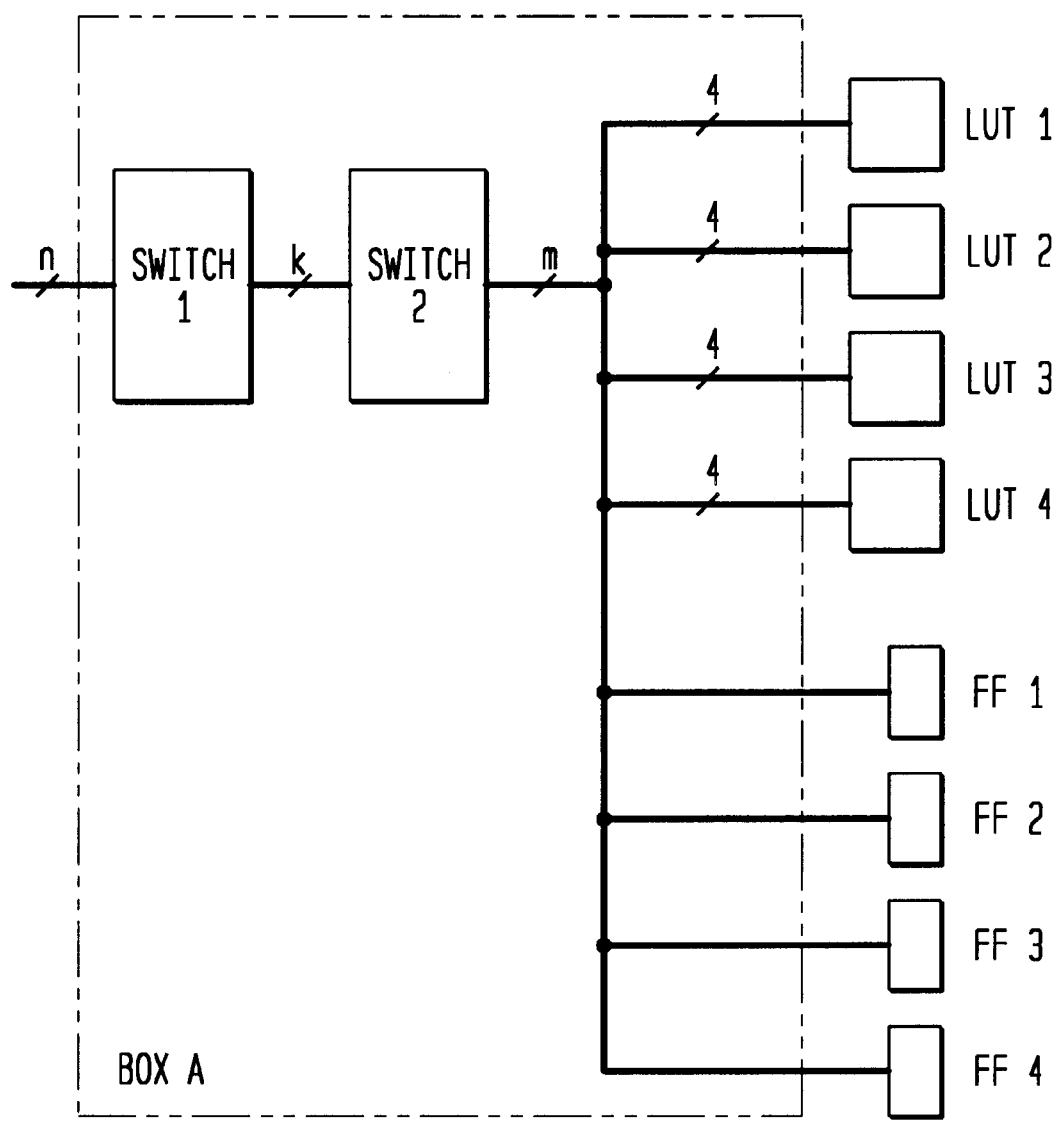
FIG. 4 shows a logic cell of the present invention in which the flexible input structure is divided into two switches.

FIG. 4 shows a logic cell of the present invention in which the flexible input structure is divided into two switches, where n>k and m>k. As before, the maximum number of distinct signals that can be connected from routing resources to logic element input pins is k. Input sharing is accomplished not by the wires connecting Switch 2 to the logic element inputs (which would be fixed), but in the switching structure itself (which is programmable per instance). Other implementations of this invention are possible. For example, the input structure could have more or fewer levels of switches than the two shown in FIG. 4, or the logic elements to which the input structure connects could be located in an I/O cell rather than a PFU.

Figure 3:
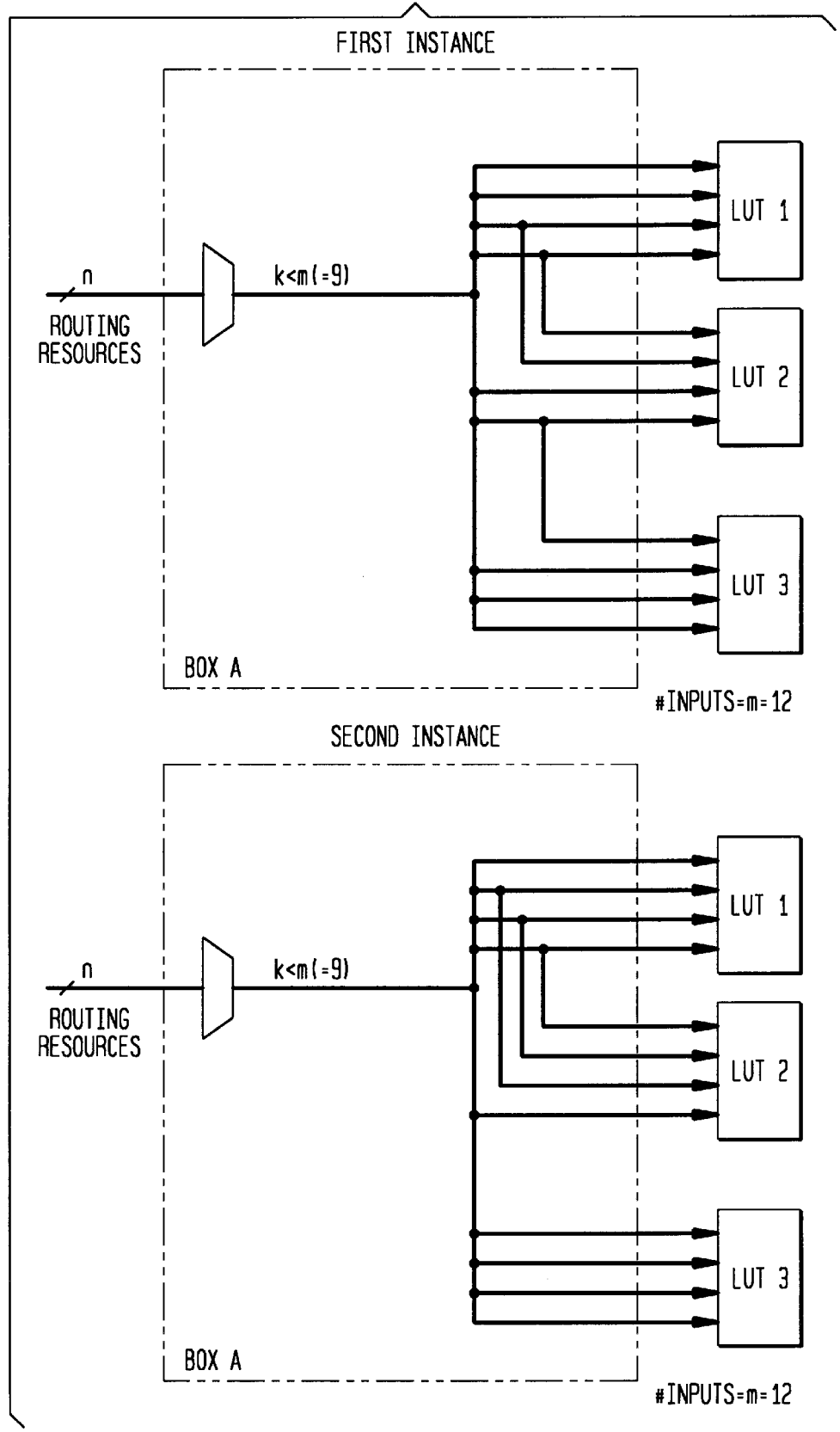
FIGS. 3A and 3B show two different instances of an FPGA logic cell having a flexible input structure, according to one embodiment of the present invention.

FIG. 4 shows two other important aspects of the present invention. In the example of FIG. 3, only sharing between LUT inputs was shown, but the concepts of this invention can easily be used with any internal logic elements, such as FFs, latches, simple logic gates, etc., that are contained within a PFU. Another important aspect is that, when configuring the flexible sharing of input signals between input pins, it is also possible that some of the instances may be configured to prevent any and all of the input signals from connecting to one or more of the input pins of some of the internal logic elements found in a given PFU. An example of this is the FFs that are shown in FIG. 4. FPGAs typically contain many more FFs than are typically used in a user's circuit; thus, many of the FFs in a given PFU might not be used. If the FFs are not used, no input signals need to be connected to the FF inputs and these input signals can therefore be used by the other logic elements in the given PFU, such as the LUTs in FIG. 4.

Using the present invention, an FPGA can be designed to implement more logic in a given silicon area compared to a prior-art FPGA with logic elements that have fixed input sharing. Moreover, the FPGAs of the present invention can typically operate at a higher speed than one that has no logic element input sharing.

Figure 5:
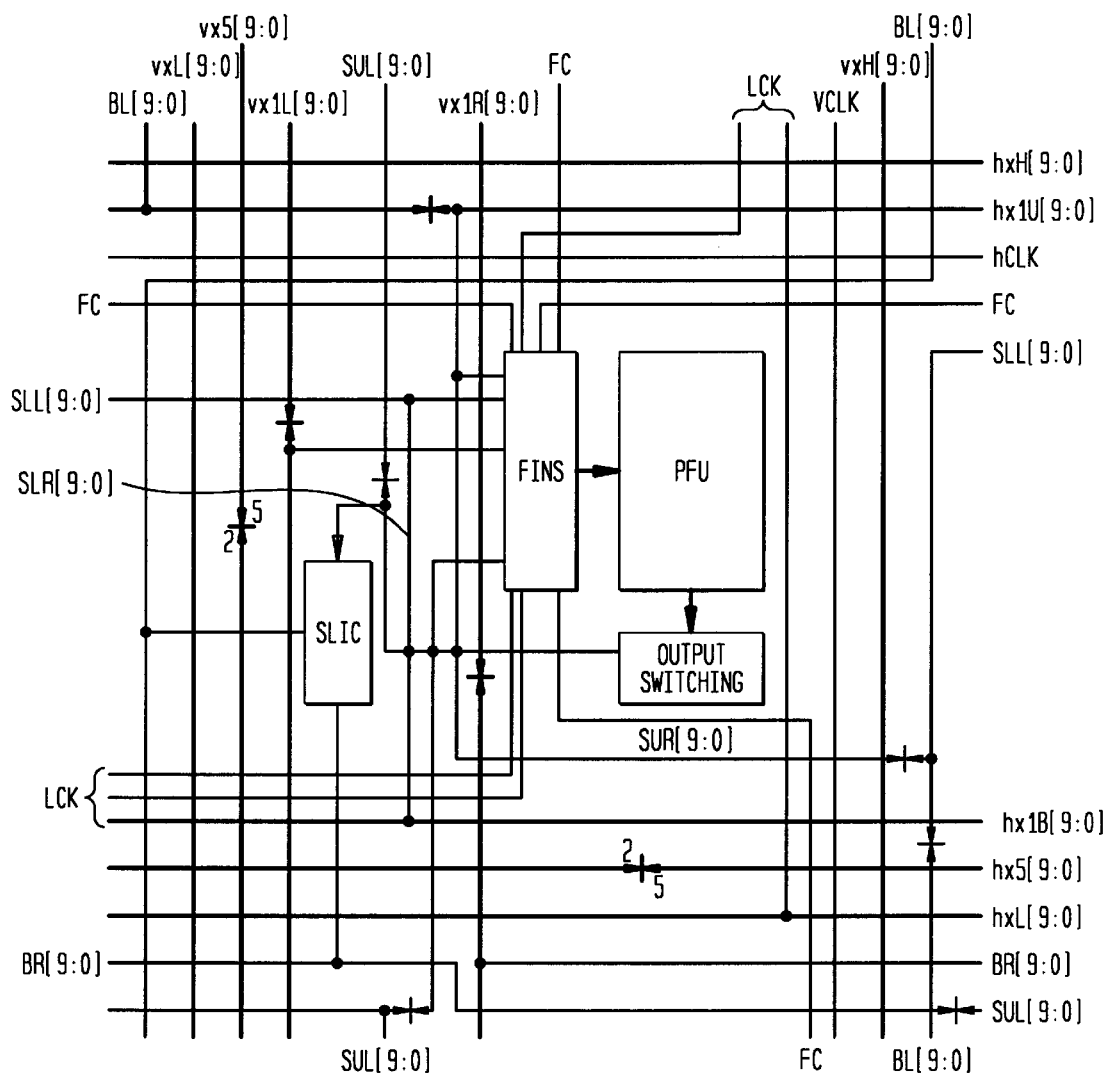
FIG. 5 shows a block diagram of an FPGA logic cell, according to one embodiment of the present invention.

FIG. 5 shows a block diagram of an FPGA logic cell, according to one embodiment of the present invention. The PFU corresponds to the LUTs of FIGS. 3A–B, while the flexible input structure corresponds to Box A of FIGS. 3A–B. The FINS in each logic cell provides the flexibility of a crossbar switch from the routing resources to the PFU inputs while taking advantage of the routability of shared inputs.

Figure 6:
FIG. 6 shows a more detailed view of the logic cell of FIG. 5.

FIG. 6 shows a more detailed view of the logic cell of FIG. 5. The FINS of FIGS. 5 and 6 is a switch matrix that provides high connectivity while retaining routing capability. Connectivity between the routing resources and the PFU inputs is provided in two stages. The primary FINS switch has 50 inputs that connect the routing resources to the 35 inputs on the secondary FINS switch. The outputs of the second switch connect to the 50 PFU inputs. The switches are implemented to provide connectivity for bused signals and individual connections.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A programmable logic device (PLD) comprising a plurality of logic cells, wherein at least one logic cell has a flexible input structure (FINS) that supports two or more different configurable connection schemes between routing resources and input pins of one or more logic elements within the logic cell, wherein the number of different input signals for each and every connection scheme between the routing resources and the logic element input pins is less than the number of logic element input pins.

2. The PLD of claim 1, wherein the PLD is an FPGA.

3. The PLD of claim 1, wherein the connection schemes for each logic cell having a FINS are reconfigurable.

4. The PLD of claim 1, wherein the number of different input signals for each and every connection scheme is fixed from logic cell to logic cell.

5. The PLD of claim 1, wherein each logic cell having a FINS is adapted to be configured independent of each other logic cell having a FINS such that the configured connection scheme is adapted to vary from logic cell to logic cell.

6. The PLD of claim 1, wherein the FINS of two or more logic cells have different connection schemes.

7. The PLD of claim 6, wherein the FINS for two or more logic cells have a different number of different input signals between the routing resources and the logic elements.

8. The PLD of claim 1, wherein the logic elements comprise at least one look-up table.

9. The PLD of claim 1, wherein the logic elements comprise at least one flip-flop connected to directly receive one of the input signals.

10. The PLD of claim 1, wherein the available connection schemes depend on a selected operational mode for the logic cell selected from a set comprising a general logic mode and one or more of a multiplier mode, a memory mode, a comparator mode, and a datapath with ripple carry mode.

11. The PLD of claim 10, wherein the number of different input signals between the routing resources and input pins varies between at least two logic cell operational modes.

12. A PLD comprising a plurality of logic cells, each logic cell comprising a number of input signal connections between routing resources and at least one programmable function unit (PFU) having a number of inputs, where the maximum number of input signals is less than the number of inputs to the PFU and the distribution of the connections to the PFU inputs is configurable from logic cell to logic cell within the PLD.

13. The PLD of claim 12, wherein the PLD is an FPGA.

14. The PLD of claim 12, wherein at least one of the configurable connection schemes involves input sharing.

15. The PLD of claim 14, wherein, in a first connection scheme, a first pair of input pins share a first input signal, and, in a second connection scheme, the first pair of input pins do not share the first input signal.

16. The PLD of claim 12, wherein the connection schemes for each logic cell having a FINS are reconfigurable.

17. The PLD of claim 12, wherein the maximum number of possible connections is fixed from logic cell to logic cell.

18. The PLD of claim 12, wherein each logic cell having a FINS is adapted to be configured independent of each other logic cell having a FINS such that a configured connection scheme is adapted to vary from logic cell to logic cell.

19. The PLD of claim 18, wherein the FINS of two or more logic cells have different connection schemes.

20. The PLD of claim 19, wherein the FINS for two or more logic cells have a different number of maximum connections between the routing resources and the PFU.

21. The PLD of claim 12, wherein the PFU comprises at least one look-up table.

22. The PLD of claim 12, wherein the PFU comprises at least one flip-flop connected to directly receive one of the input signals.

23. The PLD of claim 12, wherein the available connection schemes depend on a selected operational mode for the logic cell selected from a set comprising a general logic mode and one or more of a multiplier mode, a memory mode, a comparator mode, and a datapath with ripple carry mode.

24. The PLD of claim 23, wherein the maximum number of connections between the routing resources and input pins varies between at least two logic cell operational modes.

* * * * *